US012581839B2

(12) United States Patent
Peng et al.

(10) Patent No.: US 12,581,839 B2
(45) Date of Patent: Mar. 17, 2026

(54) DISPLAY PANEL, METHOD FOR MANUFACTURING DISPLAY PANEL AND DISPLAY DEVICE

(71) Applicant: BOE TECHNOLOGY GROUP CO., LTD., Beijing (CN)

(72) Inventors: Weiting Peng, Beijing (CN); Qian Wu, Beijing (CN); Fang Cheng, Beijing (CN); Qiuyu Ling, Beijing (CN); Wei Wang, Beijing (CN); Pengxia Liang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 472 days.

(21) Appl. No.: 18/028,802

(22) PCT Filed: May 31, 2022

(86) PCT No.: PCT/CN2022/096117
§ 371 (c)(1),
(2) Date: Mar. 28, 2023

(87) PCT Pub. No.: WO2023/230802
PCT Pub. Date: Dec. 7, 2023

(65) Prior Publication Data
US 2025/0081821 A1 Mar. 6, 2025

(51) Int. Cl.
*H10K 59/80* (2023.01)
*H10K 59/12* (2023.01)
*H10K 102/00* (2023.01)

(52) U.S. Cl.
CPC ....... *H10K 59/879* (2023.02); *H10K 59/1201* (2023.02); *H10K 59/873* (2023.02); *H10K 2102/351* (2023.02)

(58) Field of Classification Search
CPC ............. H10K 59/879; H10K 59/1201; H10K 59/873; H10K 2102/351
See application file for complete search history.

(56) References Cited

FOREIGN PATENT DOCUMENTS

| | | |
|---|---|---|
| CN | 110133773 A | 8/2019 |
| CN | 109669226 B | 1/2020 |
| CN | 111061070 A | 4/2020 |
| CN | 113471390 A | 10/2021 |
| CN | 114388603 A | 4/2022 |

OTHER PUBLICATIONS

CN 114388603 Machine English Translation (Year: 2022).*

* cited by examiner

*Primary Examiner* — Anne M Hines
(74) *Attorney, Agent, or Firm* — HOUTTEMAN LAW LLC

(57) ABSTRACT

The present disclosure provides a display panel, including: a driving backplane; a light-emitting unit layer located on a side of the driving backplane and comprising at least one light-emitting pixel unit; a metasurface composite structure layer located on a light-exiting side of the light-emitting pixel unit and including at least two metasurface micro-lens structure layers, which are sequentially arranged in a direction away from the light-emitting pixel unit and are independent of each other, where the metasurface micro-lens structure layers are configured to modulate a phase of light incident thereinto so as to converge the light. Embodiments of the present disclosure further provide a method for manufacturing a display panel and a display device.

17 Claims, 8 Drawing Sheets

(a)                                        (b)

structure in the first
metasurface micro-lens
structure layer

⬤ ⬤ ⬤ ⊕ ⬤ ⊘  ⬤⬤  eight types of micro-pillars metasurface micro-lens
structure in the second
metasurface micro-lens structure layer Eight typs of micro-pillars relative brightness light-exiting angle relative brightness light-exiting angle

DISPLAY PANEL, METHOD FOR MANUFACTURING DISPLAY PANEL AND DISPLAY DEVICE

TECHNICAL FIELD

The present disclosure relates to the field of display technology, and in particular, to a display panel, a method for manufacturing a display panel, and a display device.

BACKGROUND

An Organic Light-Emitting diode (OLED) is a display illumination technology that has been gradually developed in recent years, and in particular, in the display industry, an OLED display is regarded as having a wide application prospect because of its advantages of fast response speed, high contrast, flexibility, and the like.

A silicon-based OLED micro-display combines a CMOS (Complementary Metal Oxide Semiconductor) process and the OLED technology, and has characteristics of self-luminescence, adopting a silicon substrate and the like. A silicon-based OLED has characteristics of small volume, light-weight, low power consumption, high resolution (PPI, pixels per inch), and is a core device of a near-to-eye display system, especially is the trend of next-generation micro-display technology. Light-emitting mechanism of the silicon-based OLED is that a light-emitting material emits light under the action of an electric field. Generally, a same voltage is applied to all light-emitting pixels for emitting light. However, in practical developments or applications, it is found that, since the OLED has a characteristic of lambertian luminescence, there is a problem that brightness of the pixels is low for a display device with high PPI.

SUMMARY

In a first aspect, an embodiment of the present disclosure provides a display panel, including:

a driving backplane;

a light-emitting unit layer located on a side of the driving backplane and including at least one light-emitting pixel unit;

a metasurface composite structure layer located on a light-exiting side of the light-emitting pixel unit and including at least two metasurface micro-lens structure layers, which are sequentially arranged in a direction away from the light-emitting pixel unit and are independent of each other, where the metasurface micro-lens structure layers are configured to modulate a phase of light incident thereinto so as to converge the light.

In some implementations, a transparent spacer layer is formed between adjacent metasurface micro-lens structure layers.

In some implementations, the transparent spacer layer is in contact with the metasurface micro-lens structure layers closest thereto at both sides thereof; and a refractive index of the transparent spacer layer is less than that of each of the metasurface micro-lens structure layers in contact therewith.

In some implementations, a packaging cover plate is provided at a side of the metasurface composite structure layer away from the driving backplane.

In some implementations, a packaging cover plate is provided on a side of the metasurface composite structure layer away from the driving backplane:

the at least two metasurface micro-lens structure layers include: a first metasurface micro-lens structure layer and a second metasurface micro-lens structure layer;

a supporting structure is provided between the packaging cover plate and the driving backplane, the supporting structure being configured to support the packaging cover plate and the driving backplane; and the first metasurface micro-lens structure layer is fixed to the driving backplane, and the second metasurface micro-lens structure layer is fixed to the packaging cover plate.

In some implementations, the supporting structure is located in an edge region of the driving backplane and/or in a region between adjacent light-emitting pixel units.

In some implementations, each metasurface micro-lens structure layer includes at least one metasurface micro-lens structure corresponding to the light-emitting pixel unit one by one, with the metasurface micro-lens structure being arranged opposite to the light-emitting pixel unit corresponding thereto, and a distance between a center of an orthographic projection of the metasurface micro-lens structure on the driving backplane and a center of an orthographic projection of a light-exiting region of the light-emitting pixel unit corresponding to the metasurface micro-lens structure on the driving backplane being less than or equal to 0.3 $\mu m$;

a distance between centers of orthographic projections of any two metasurface micro-lens structures, corresponding to the same light-emitting pixel unit, in different metasurface micro-lens structure layers on the driving backplane is less than or equal to 0.3 $\mu m$.

In some implementations, all the metasurface micro-lens structures corresponding to the same light-emitting pixel unit and located in different metasurface micro-lens structure layers constitute a metasurface composite micro-lens structure corresponding to the light-emitting pixel unit; and the light-emitting pixel unit is located at a focal point of the metasurface composite micro-lens structure corresponding thereto.

In some implementations, all the metasurface micro-lens structures corresponding to the same light-emitting pixel unit and located in different metasurface micro-lens structure layers constitute a metasurface composite micro-lens structure corresponding to the light-emitting pixel unit; and a numerical aperture of the metasurface composite micro-lens structure is greater than or equal to 0.7.

In some implementations, the metasurface micro-lens structure includes a plurality of micro-pillars having a same height; and a ratio of the height of each micro-pillar to an equivalent diameter of a cross-section of the micro-pillar parallel to the driving backplane is less than or equal to 5:1.

In some implementations, a number of phase orders of the micro-pillars of the metasurface micro-lens structure in each metasurface micro-lens structure layer ranges from 4 to 8.

In some implementations, numbers of phase orders of the metasurface micro-lens structures in the metasurface micro-lens structure layers are the same;

numbers of the micro-pillars in the metasurface micro-lens structures in the metasurface micro-lens structure layers are the same;

the micro-pillars in the metasurface micro-lens structures in the metasurface micro-lens structure layers are arranged in a same manner.

In some implementations, a cross-section of each micro-pillar parallel to the driving backplane is circular or square.

In some implementations, a distance between any two adjacent metasurface micro-lens structure layers in a direction perpendicular to the driving backplane ranges from 0.8 μm to 1.2 μm.

In some implementations, a number of the metasurface micro-lens structure layers in the metasurface composite structure layer is two.

In some implementations, an encapsulation layer is provided between the light-emitting unit layer and the metasurface composite structure layer.

In a second aspect, an embodiment of the present disclosure further provides a display device, including the display panel as provided in the first aspect.

In a third aspect, an embodiment of the present disclosure further provides a method for manufacturing a display panel, the method may be used to manufacture the display panel provided in the first aspect, and the method includes:

providing a driving backplane;

forming a light-emitting unit layer on the driving backplane, the light-emitting unit layer including at least one light-emitting pixel unit; and forming a metasurface composite structure layer on a light-exiting side of the light-emitting pixel unit, where the metasurface composite structure layer includes at least two metasurface micro-lens structure layers, which are sequentially arranged in a direction away from the light-emitting pixel unit and are independent of each other, and the metasurface micro-lens structure layers are configured to modulate light incident thereinto so as to converge the light.

In some implementations, the forming the metasurface composite structure layer on the light-exiting side of the light-emitting pixel unit includes:

alternately forming the metasurface micro-lens structure layer and a transparent spacer layer on the light-exiting side of the light-emitting pixel unit.

In some implementations, the forming the metasurface composite structure layer on the light-exiting side of the light-emitting pixel unit includes:

forming a first metasurface micro-lens structure layer on a side of the light-emitting unit layer away from the driving backplane;

forming a second metasurface micro-lens structure layer on a side of the packaging cover plate close to the driving backplane; and forming a supporting structure between the driving backplane and the packaging cover plate, and aligning and fixing the driving backplane with the packaging cover plate.

DETAIL DESCRIPTION OF EMBODIMENTS

To make the objects, technical solutions and advantages of the present disclosure more apparent, the technical solutions in the embodiments of the present disclosure will be clearly and completely described below with reference to the accompanying drawings in the embodiments of the present disclosure, and it is to be understood that the described embodiments are some, but not all embodiments of the present disclosure. All other embodiments, which can be derived by a person skilled in the art from the embodiments disclosed herein without in creative effort, are intended to be within the scope of the present disclosure.

In the embodiments of the present disclosure, a light-emitting pixel unit refers to a minimum unit, for emitting light, of a display panel. The light-emitting pixel unit may be a current-driven type light-emitting element. For convenience of description, the light-emitting pixel unit is exemplarily described as an OLED.

In the expression of a range from A to B in the present disclosure, the defined range includes both endpoints A and B.

Figure 1:
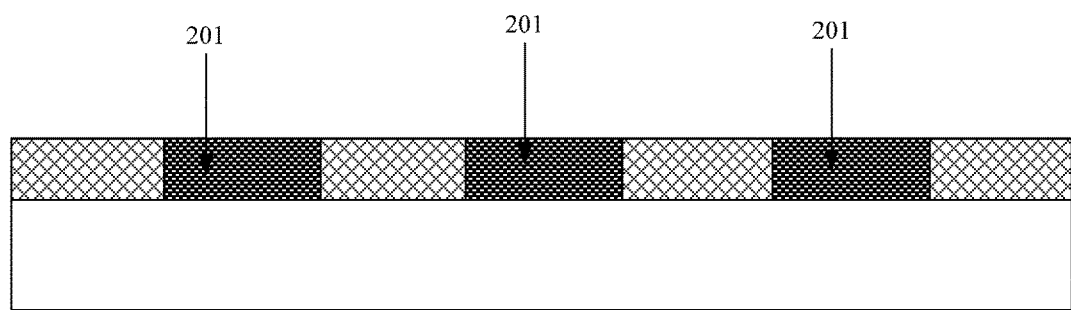
FIG. 1 is a schematic cross-sectional view of a display panel in the related art.

FIG. 1 is a schematic cross-sectional view of a display panel in the related art, and as shown in FIG. 1, since an OLED has a lambertian luminescence characteristic, light emitted by a light-emitting pixel unit 201 in the display panel in the related art also has the lambertian luminescence characteristic. It has been found from a test that the light emitted from the light-emitting pixel unit 201 in the display panel in the related art has an energy utilization rate of only about 40% in a direction at a front viewing angle (ranging from −15° to +15°).

In order to improve the brightness of the light-emitting pixel unit 201 at the front viewing angle, a technical solution of constructing a metasurface micro-lens structure on a light-exiting side of the light-emitting pixel unit 201 to converge the light emitted from the light-emitting pixel unit 201 is also proposed in the related art.

Figure 2:
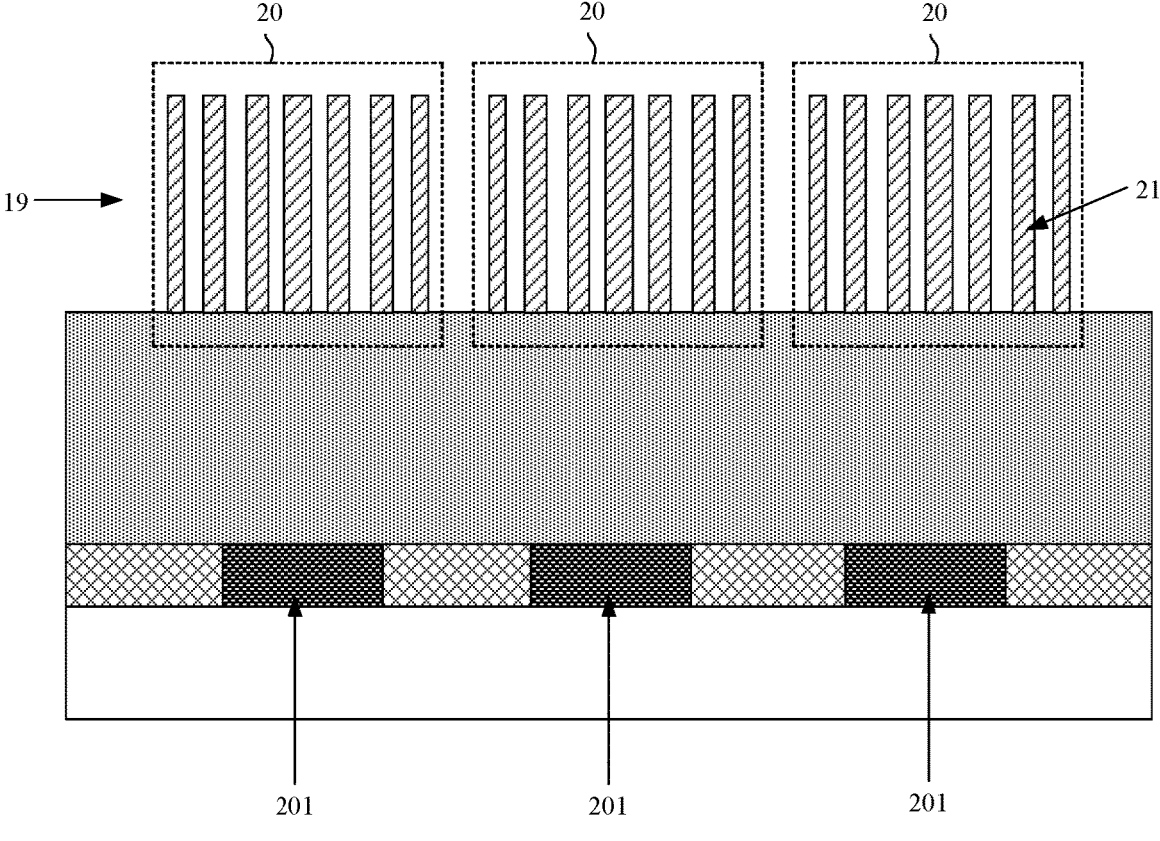
FIG. 2 is a schematic cross-sectional view of a display panel in the related art.

FIG. 2 is another schematic cross-sectional view of a display panel in the related art, and as shown in FIG. 2, a metasurface micro-lens structure layer 19 is additionally provided on a light-exiting side of light-emitting pixel units 201, where the metasurface micro-lens structure layer 19 includes metasurface micro-lens structures 20 (only three light-emitting pixel units 201 and three metasurface micro-lens structures 20 corresponding thereto are exemplarily shown in FIG. 2) corresponding to the light-emitting pixel units 201 one by one, each metasurface micro-lens structure 20 includes a structure composed of a group of micro-pillars 21 (also referred to as nano-pillars) arranged according to a certain rule and having a specific phase modulation solution, and a metasurface lens with a large numerical aperture is constructed according to a phase expression and a discrete result of the lens. A height of each micro-pillar 21 is generally in the order of hundreds of nanometers (in a range from 100 nm to 1000 nm). Based on the metasurface micro-lens structures 20, the light emitted from the OLED can be converged under a condition of a low placement height (less than or equal to 1000 nm), so that the brightness of the light-emitting pixel unit 201 at the front viewing angle is improved.

The principle of constructing the metasurface micro-lens structure 20 is based on that the micro-pillars 21 with discrete phase modulation effect are discretized and correspondingly arranged with respect to the phase expression of the lens, so that the light can be modulated under the condition of a low device thickness (in the order of hundred nanometers). In the process of designing the metasurface lens, a structural period of the micro-pillars 21 is usually in the order of half wavelength, a height of each micro-pillar 21 is in the order of hundred nanometers, and an equivalent diameter of each micro-pillar 21 is in the order of tens of nanometers to hundreds of nanometers. For a phase surface to be expressed by the metasurface lens, a phase distribution of the lens is to be calculated by a phase expression formula according to a lens aperture D and a desired focal length f of the lens, and the phase surface is mapped into a range from 0 to 2 π and then is discretized according to the structural period of the micro-pillars 21, so that the phase distribution corresponding to an arrangement of the micro-pillars 21 is obtained. The phase distribution corresponding to the arrangement of the micro-pillars 21 in the metasurface micro-lens structure 20 satisfies the following formulas:

$$\varphi(r, \lambda) = \frac{2\pi}{\lambda}\left(\sqrt{r^2 + f^2} - f\right)\ldots, \qquad \text{formula (1),}$$

$$r = \sqrt{x^2 + y^2}\ldots, \qquad \text{formula (2),}$$

where r represents a radial distance between the micro-pillar 21 at a position of coordinates (x, y) and a center point (0, 0) of the metasurface micro-lens structure 20, r is greater than or equal to 0 and less than or equal to D/2, λ represents a wavelength of incident light, $\varphi(r, \lambda)$ represents a phase at a position with a radial distance r, and f represents a focal length. The phase distribution within the metasurface micro-lens structure 20 for the wavelength λ, and the focal length f can be obtained according to the above formulas.

Meanwhile, considering sizes of the micro-pillars 21, for the sake of accuracy and convenience of design and expression, the phases of the micro-pillars 21 within the metasurface micro-lens structure 20 are generally expressed in m orders (i.e., a number of phase orders of the micro-pillars 21 within the metasurface micro-lens structure 20 is m). That is, the metasurface micro-lens structure 20 includes m types of micro-pillars 21 (each type of micro-pillar 21 corresponds to one phase value) with m different phase values respectively ranging from 0 to 2π. With the above operation, the phase expression of the metasurface micro-lens structure 20 can be further discretized into an expression relation with a certain distribution of phase orders.

As a specific example, the m phase values may include $$\frac{1}{m}*2\pi, \frac{2}{m}*2\pi, \ldots, \frac{m-1}{m}*2\pi,$$

and 2π. Certainly, other methods may be adopted to select m phase values within the range from 0 to 2π, and in the process of selecting the m phase values, it should be ensured that the m phase values are uniformly distributed within the range from 0 to 2π as much as possible, so as to ensure the accurate expression of the lens. Generally, the larger the value of m is, the more accurate the expression of the metasurface micro-lens structure 20 is, and the higher the focusing efficiency of the metasurface micro-lens structure 20 is, but the more the number of the micro-pillars 21 to be arranged is, the smaller the structural period of the micro-pillars 21 is, and the higher the difficulty of the preparation process is.

As an example, by substituting $$\varphi(r, \lambda) = \frac{1}{m}*2\pi$$

into the above formula (1), a magnitude of r can be solved in a case where both the wavelength λ and the focal length f are known; and a position distribution of the micro-pillars 21 corresponding to the phase value of $$\frac{1}{m}*2\pi$$

is obtained by the above formula (2).

For performing a modulation by the metasurface lens, an aspect ratio of each micro-pillar 21 is desired to satisfy an expectation, since the transmissive metasurface micro-lens structure 20 in the above solution can achieve a desired phase retardation solution based on an equivalent refractive index formed by the micro-pillars 21, made of a material with a high refractive index (which is generally greater than 1.8) with a corresponding structural period, in combination with the height of each micro-pillar 21. The phase value of each micro-pillar 21 satisfies:

$$\varphi = \frac{2\pi}{\lambda}*n_{eff}*H, \qquad \text{formula (3)}$$

where, $\varphi$ is the phase value corresponding to the micro-pillar 21, H is the height of the micro-pillar 21, and $n_{eff}$ is the equivalent refractive index of the micro-pillar 21. The $n_{eff}$ is associated with the refractive index of the micro-pillar 21 itself, a refractive index of a material surrounding the micro-pillar 21, and a duty ratio of the micro-pillar 21.

The aspect ratio of the micro-pillar 21 refers to a ratio of the height H of the micro-pillar 21 to an equivalent diameter d of the micro-pillar 21 (an equivalent diameter of a cross-section perpendicular to a height direction); the duty ratio of the micro-pillar 21 refers to a ratio of the equivalent diameter d of the micro-pillar 21 to a period P of an arrangement of the micro-pillars 21 (a distance between center points of any two adjacent micro-pillars 21 in a row direction or a column direction, which is a predetermined constant value).

As an example, by substituting $$\varphi = \frac{1}{m} * 2\pi$$

into the above formula (3), the equivalent refractive index $n_{eff}$ of the micro-pillar 21 can be obtained in the case where both the wavelength $\lambda$ and the height of the micro-pillar 21 are known; based on the known equivalent refractive index of the micro-pillar 21, the refractive index of the micro-pillar 21 itself, the refractive index of the material surrounding the micro-pillar 21, and the period P of the arrangement of the micro-pillars 21, the equivalent diameter d of each micro-pillar 21 corresponding to the phase value of $$\frac{1}{m} * 2\pi$$

can be obtained.

It should be noted that, in the case where the equivalent refractive index $n_{eff}$ of the micro-pillar 20, the refractive index of the micro-pillar 21 itself, and the refractive index of the material surrounding the micro-pillars 21 are all constant, the smaller the period P of the arrangement of the micro-pillars 21 is, the smaller the equivalent diameter d of each micro-pillar 21 obtained is.

In practical applications, it is desired that each micro-pillar 21 has a specific height H and an enough small equivalent diameter d to form a group of micro-pillars 21 covering a phase modulation range from 0 to $2\pi$.

Figures 3, 4:
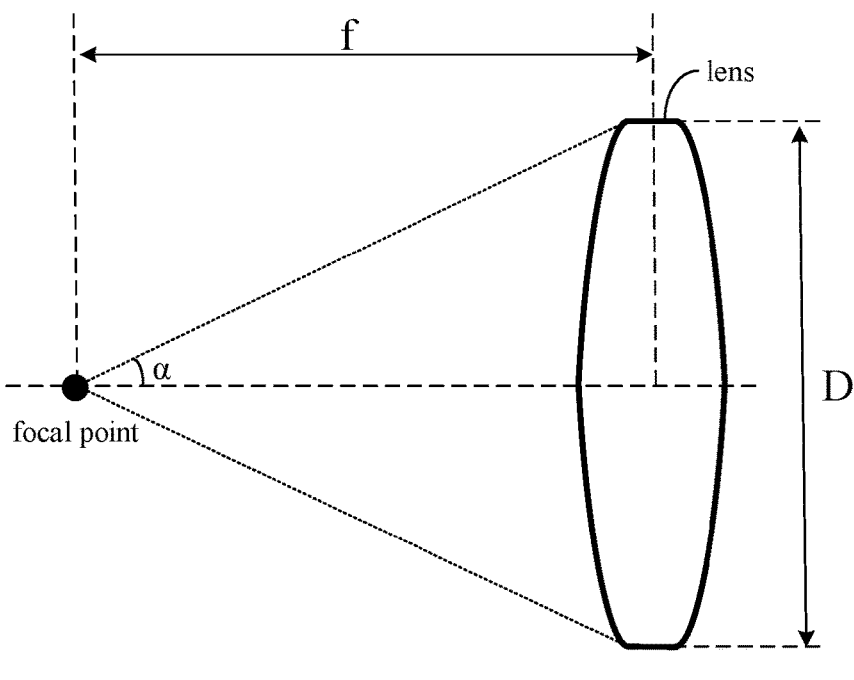
FIG. 3 is a schematic diagram illustrating a lens aperture, an aperture angle, and a focal length of a lens.
FIG. 4 is a schematic cross-sectional view of a display panel in an embodiment of the present disclosure.

FIG. 3 is a schematic diagram of a lens aperture, an aperture angle and a focal length of a lens, and as shown in FIG. 3, a numerical aperture (NA) of the lens is a product of a refractive index $n_0$ of a medium between the lens and an object to be inspected and a sine of half of the aperture angle $2\alpha$, that is:

$$NA = n_0 * \sin\alpha. \qquad \text{frmula (4)}$$

The aperture angle, also known as a "lens opening angle", is an angle formed by an object point on an optical axis of the lens and an effective diameter of the lens in front of an objective lens. The larger the aperture angle is, the greater a light flux entering the lens is, the light flux is proportional to the effective diameter of the lens and inversely proportional to the focal length.

In order to ensure the effect of converging light, the numerical aperture NA of the metasurface micro-lens structure 20 in FIG. 2 is desired to be set to be larger (generally, NA is greater than or equal to 0.7) to ensure that the light emitted from the OLED can reach the metasurface micro-lens structure 20 corresponding thereto as much as possible.

In this case, it can be seen from formula (4) that, in a case where $n_0$ is constant, the larger the NA is, the larger the sin $\alpha$ is; and as can be seen from FIG. 3 that, in a case where the lens aperture D is constant, the larger the sin $\alpha$ is, the smaller the focal length f is.

In the related art, the light emitted by the OLED is blue light (with a wavelength set to be 450 nm), the height of each micro-pillar 21 in the metasurface micro-lens structure 20 is set to be 500 nm, the period of the arrangement of the micro-pillars 21 is set to be 500 nm, the refractive index of each micro-pillar 21 is set to be 2.03, the lens aperture D in the metasurface micro-lens structure 20 is set to be 4.5 μm, the numerical aperture NA of the metasurface micro-lens structure 20 is set to be 70%, and the number of phase orders of the metasurface micro-lens structure 20 is set to be 8. The following micro-pillar structure library may be obtained by software simulation.

| wavelength 450 nm | | | | | | | |
|---|---|---|---|---|---|---|---|
| phase value φ (°) | 0 | 45 | 90 | 140 | 200 | 242 | 289 | 334 |
| equivalent diameter d (nm) | 170 | 130 | 90 | 80 | 120 | 150 | 160 | 190 |

It can be seen from above that, in the case where the height H of the micro-pillar 21 is designed to be 500 nm and the numerical aperture NA of the metasurface micro-lens structure 20 is set to be 0.7, equivalent diameters, ranging from 80 nm to 190 nm, of eight types of micro-pillars 21 corresponding to eight different phase values are obtained, the aspect ratio of each micro-pillar 21 is in a range from 500:190 to 500:80; that is, there are some micro-pillars 21 each having an aspect ratio greater than 5:1.

During actually producing the above-described micro-lens structure 20, it was found that for preparing the micro-pillar with the aspect ratio greater than 5:1, the difficulty in etching process is extremely great; meanwhile, the structure with the aspect ratio in the nanoscale has poor stability, is easy to incline in subsequent processing and usage, and is not beneficial to the mass production application of devices.

In addition, in the related art, in order to ensure the effect of converging light, the numerical aperture NA of the metasurface micro-lens structure 20 is desired to be set to be larger (generally, NA is greater than or equal to 0.7), in this case, the focal length of the lens is correspondingly reduced, and the number of phase orders to be set is increased, so as to ensure the continuity of phase expression.

As described above, as the number m of phase orders increases, the greater the number of micro-pillars 21 to be disposed is, the smaller the period P of the arrangement of the micro-pillars 21 is, the smaller the equivalent diameter d of each micro-pillar 21 obtained through the above formula (3) is, and accordingly, the larger the aspect ratio of each micro-pillar 21 is, the more the difficulty in the etching process is, and the poorer the stability of the micro-pillars 21 is. Meanwhile, due to the increase of the number m of phase orders, the types of the micro-pillars 21 (different types of micro-pillars 21 correspond to different phase values and have different equivalent diameters d, and the micro-pillars 21 of the same type correspond to the same phase value and have the same equivalent diameter d) included in the metasurface micro-lens structure 20 are increased, and in this case, the etching precision of the etching process is desired to be higher.

The present disclosure provides a corresponding solution to effectively overcome at least one of the technical problems in the related art. With the technical solution, the effect of converging light emitted from the light-emitting pixel unit can be met, meanwhile, the numerical aperture NA of the metasurface micro-lens structure in the metasurface micro-lens structure layer arranged in the display panel can be smaller, the number of phase orders of the metasurface micro-lens structure can be smaller, the aspect ratio of the nano-pillar in the metasurface micro-lens structure can be effectively reduced, and an expectation for the etching precision in the process of preparing the metasurface micro-lens structure can be effectively reduced.

Figure 5:
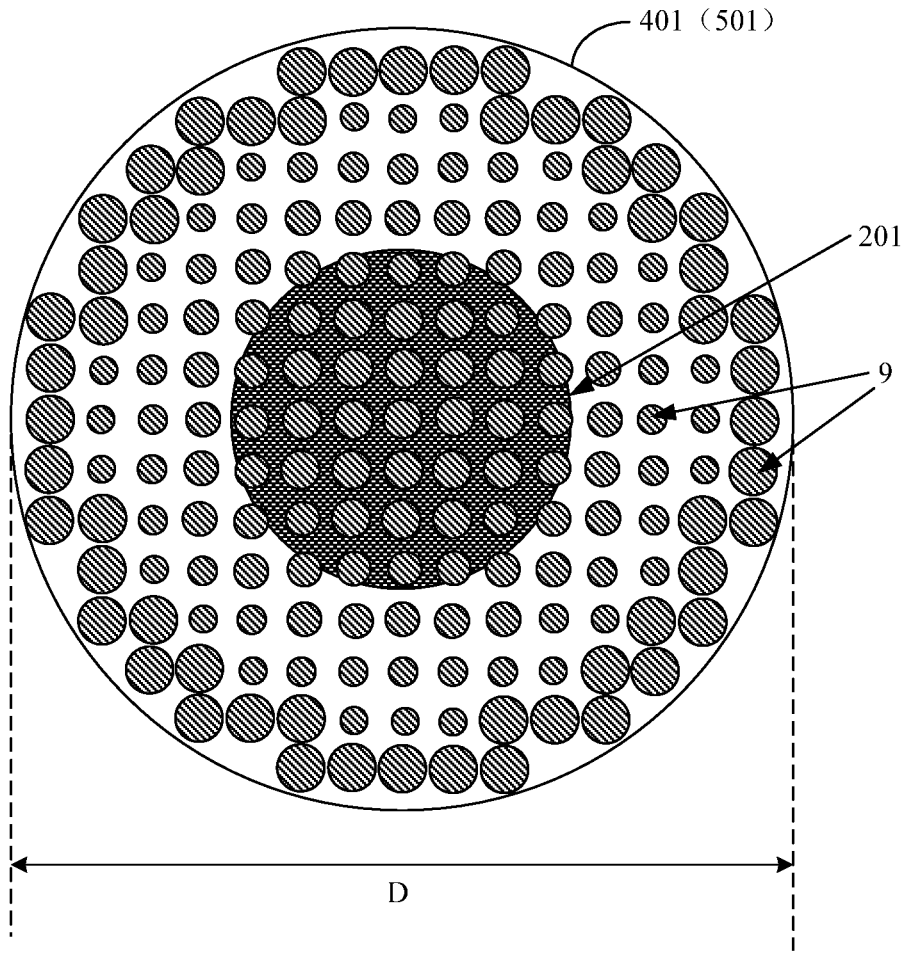
FIG. 5 is a schematic top view of a light-emitting pixel unit and a metasurface micro-lens structure corresponding thereto in an embodiment of the present disclosure.

FIG. 4 is a schematic cross-sectional view of a display panel in an embodiment of the present disclosure, and FIG. 5 is a schematic top view of a light-emitting pixel unit and a metasurface micro-lens structure corresponding thereto in an embodiment of the present disclosure, as shown in FIGS. 4 and 5, the display panel includes: a driving backplane 1, a light-emitting unit layer 2 and a metasurface composite structure layer 3.

In some implementations, the display panel provided by the embodiment of the present disclosure may be a silicon-based OLED display panel, the driving backplane 1 includes a wafer base and pixel driving circuits for forming silicon-based OLEDs on the wafer base using a standard CMOS process.

The light-emitting unit layer 2 is located on a side of the driving backplane 1 and includes at least one light-emitting pixel unit 201. In some implementations, the light-emitting pixel unit 201 is an OLED. The OLED includes an anode, a cathode and a light-emitting functional layer positioned between the anode and the cathod: the anode, generally serving as a bottom electrode, is connected with a pixel driving circuit corresponding thereto, and may be made of a metal material with high reflective performance; the cathode generally serves as a top electrode, and may be a transmissive electrode or a semi-transmissive and semi-reflective electrode; the light-emitting functional layer at least includes an organic light-emitting layer; certainly, the light-emitting function layer may further include at least one of a hole injection layer and a hole transport layer between the organic light-emitting layer and the anode, or an electron injection layer and an electron transport layer between the organic light-emitting layer and the cathode.

In some implementations, the light-emitting unit layer 2 may further include a pixel defining layer 202, and the pixel defining layer 202 is formed therein with at least one pixel accommodating hole corresponding to the light-emitting pixel unit 201 one to one, and the light-emitting pixel unit 201 is located in the pixel accommodating hole corresponding thereto.

It should be noted that FIG. 4 only illustrates three pixel accommodating holes and three light-emitting pixel units 201 for exemplary purposes, but does not limit the technical solution of the present disclosure.

The metasurface composite structure layer 3 is located at a light-exiting side of the light-emitting pixel unit 201, and the metasurface composite structure layer 3 includes: at least two metasurface micro-lens structure layers 4 and 5 which are arranged sequentially along a direction away from the light-emitting pixel unit 201 and are independent of each other, and the metasurface micro-lens structure layers 4 and 5 are configured to perform a modulation on a phase of light incident thereinto so as to converge the light.

In the embodiment of the present disclosure, the metasurface micro-lens structure layer 4 includes at least one metasurface micro-lens structure 401 corresponding to the light-emitting pixel unit 201 one by one, the metasurface micro-lens structure layer 5 includes at least one metasurface micro-lens structure 501 corresponding to the light-emitting pixel unit 201 one by one, and the metasurface micro-lens structures 401 and 501 each are arranged opposite to the light-emitting pixel unit 201 corresponding thereto. All the metasurface micro-lens structures 401 and 501 respectively located in different metasurface micro-lens structure layers 4 and 5 and corresponding to the same light-emitting pixel unit 201 constitute a metasurface composite micro-lens structure corresponding to the light-emitting pixel unit 201.

In the embodiment of the present disclosure, a superimposition of at least two metasurface micro-lens structure layers 4 and 5 can be regarded as a superimposition of at least two condensing lenses, with such technical means, the metasurface micro-lens structure in the metasurface composite structure layer 3 can have a larger numerical aperture under the condition that the numerical apertures of the metasurface micro-lens structures 401 and 501 in the metasurface micro-lens structure layers 4 and 5 are relatively small.

Taking a case where the numerical aperture of the metasurface micro-lens structure in each single metasurface micro-lens structure layer in the related art shown in FIG. 2 being $NA_0$ as an example, in the embodiment of the present disclosure, under the condition that each of the numerical apertures of the metasurface micro-lens structures 401 and 501 in the metasurface micro-lens structure layers 4 and 5 is set to be smaller than $NA_0$, the numerical aperture of the metasurface composite micro-lens structure in the metasurface composite structure layer 3 may be $NA_0$. Therefore, the solution of the present disclosure can effectively reduce the numerical apertures of the metasurface micro-lens structures 401 and 501 in the metasurface micro-lens structure layers 4 and 5.

It can be seen from above that, with the solution of the present disclosure, in addition to that the effect of converging light emitted from the light-emitting pixel units can be realized, the numerical apertures NA of the metasurface micro-lens structures in the metasurface micro-lens structure layers arranged in the display panel each can be set to have a small value, and in this case, the number of phase orders of the metasurface micro-lens structure can also be a small value, so that the aspect ratio of each micro-pillar (nano-pillar) in the metasurface micro-lens structure can be effectively reduced, and the expectation on etching precision in the process of preparing the metasurface micro-lens structure can be effectively reduced.

The metasurface composite structure layer including two metasurface micro-lens structure layers is only exemplarily shown in FIG. 4 for illustrative purposes, and does not limit the technical solution of the present disclosure. It should be understood by those skilled in the art that the metasurface composite structure layer 3 in the embodiment of the present disclosure may include three or even more metasurface micro-lens structure layers, which are not shown in the accompanying drawings.

Referring to FIG. 4, a transparent spacer layer is formed between certain adjacent metasurface micro-lens structure layers. The transparent spacer layer may play a role of supporting the metasurface micro-lens structure layers.

In some implementations, each transparent spacer layer 6 is in contact with two metasurface micro-lens structure layers 4 and 5 closest thereto at both sides thereof: the transparent spacer layer 6 has a refractive index less than a refractive index of each metasurface micro-lens structure layer in contact therewith.

In some implementations, a difference between the refractive index of the transparent spacer layer 6 and the refractive index of each of the metasurface micro-lens structure layers 4 and 5 in contact therewith is less than or equal to −0.5.

In the embodiment of the present disclosure, the metasurface micro-lens structure layers 4 and 5 are made of a material with a high refractive index, and the refractive index of each of the metasurface micro-lens structure layers 4 and 5 is generally greater than or equal to 1.8; the transparent spacer layer 6 is made of a material with a low refractive index, and the refractive index of the transparent spacer layer 6 is generally less than or equal to 1.3.

In some implementations, a packaging cover plate 8 is provided at a side of the metasurface composite structure layer 3 away from the driving backplane 1. The packaging cover plate 8 can play a role in protecting the metasurface composite structure layer 3. The packaging cover plate 8 may be a glass cover plate.

In some implementations, an encapsulation layer 7 is formed between the light-emitting unit layer 2 and the metasurface composite structure layer 3. The encapsulation layer 7 is configured to encapsulate and protect the light-emitting pixel unit 201; the encapsulation layer 7 is generally made of an inorganic material, the encapsulation layer 7 may be used as a base of the metasurface micro-lens structure layer 4, and the metasurface micro-lens structure layer 4 may be directly formed on the encapsulation layer 7.

Figure 6:
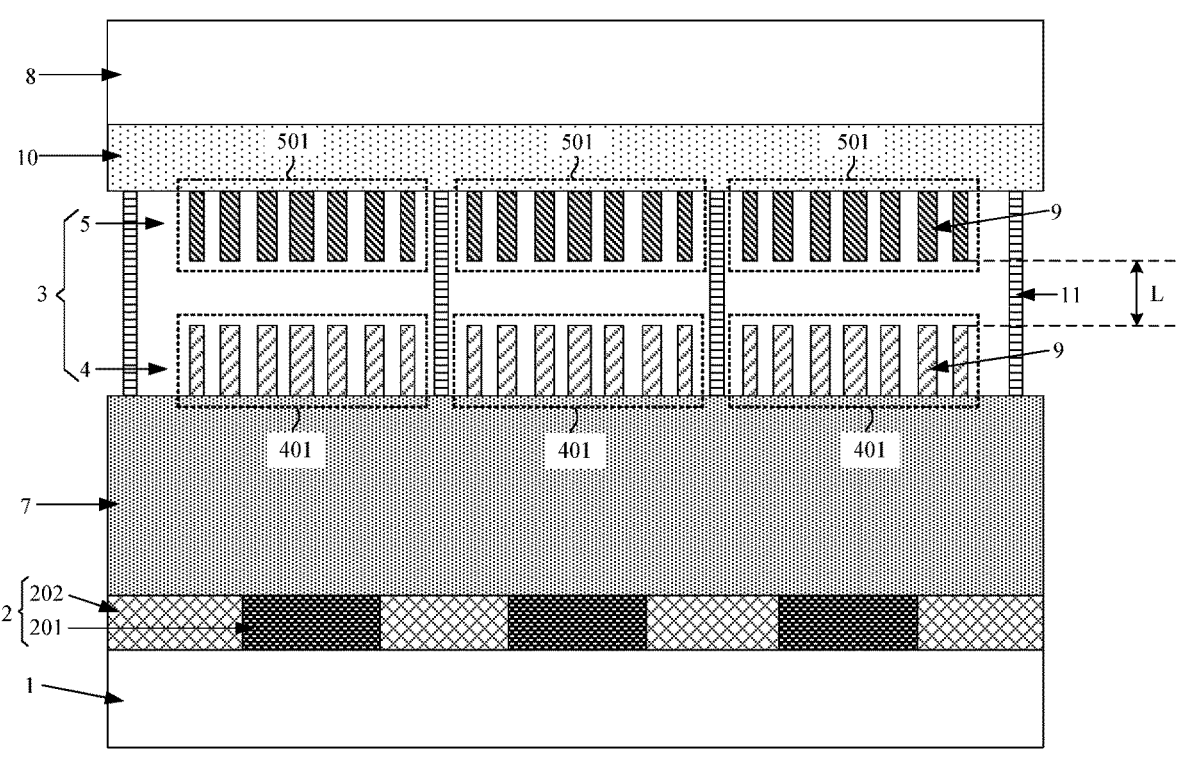
FIG. 6 is a schematic cross-sectional view of a display panel in an embodiment of the present disclosure.

FIG. 6 is another schematic cross-sectional view of a display panel in an embodiment of the present disclosure, and as shown in FIG. 6, unlike the forgoing embodiment in which the metasurface micro-lens structure layer and the transparent spacer layer 6 in the metasurface composite structure layer 3 are alternately disposed on the driving backplane 1, in the embodiment shown in FIG. 6, the metasurface micro-lens structure layer 4 is fixedly disposed on the driving backplane 1, and the metasurface micro-lens structure layer 5 is fixedly disposed on the packaging cover plate 8.

As an example, the at least two metasurface micro-lens structure layers include: a first metasurface micro-lens structure layer 4 and a second metasurface micro-lens structure layer 5, a supporting structure 11 is formed between the packaging cover plate 8 and the driving backplane 1, and the supporting structure 11 is configured to support the packaging cover plate 8 and the driving backplane 1. The first metasurface micro-lens structure layer 4 is fixed to the driving backplane 1, and the second metasurface micro-lens structure layer 5 is fixed to the packaging cover plate 8.

In the solution in which the transparent spacer layer 6 is provided, a layer of material, for forming the transparent spacer layer 6, with a certain thickness is to be prepared on a certain metasurface micro-lens structure layer through deposition, spin coating and the like, in the process of preparing the transparent spacer layer 6, the material for forming the transparent spacer layer 6 may permeate into the metasurface micro-lens structure layer (the metasurface micro-lens structure in the metasurface micro-lens structure layer includes a plurality of micro-pillars 9 (namely nano-pillars), and a spacing exists between any two adjacent micro-pillars 9), in this case, the material for forming the transparent spacer layer 6 that permeated into the metasurface micro-lens structure layer may cause reduction of an overall transmittance of the device on one hand, and may influence the lens performance expression of the metasurface micro-lens structure layer on the other hand.

In the embodiment of the present disclosure, the metasurface micro-lens structure layer 4 is fixedly disposed on the driving backplane 1, and the metasurface micro-lens structure layer 5 is fixedly disposed on the packaging cover plate 8, so that no transparent spacer layer 6 may be provided between certain adjacent super-surface micro-lens structure layers 4 and 5. Therefore, the number of transparent spacer layers 6 can be effectively reduced, and the above technical problems can be effectively solved.

In some implementations, in a case where the metasurface composite structure layer 3 only includes two metasurface micro-lens structure layers, that is, the metasurface composite structure layer 3 only includes the first metasurface micro-lens structure layer 4 and the second metasurface micro-lens structure layer 5, no transparent spacer layer 6 is provided in the display panel, and thus the above technical problem caused by the provision of the transparent spacer layer 6 can be effectively solved.

It should be noted that an alignment between the first metasurface micro-lens structure layer 4 and the second metasurface micro-lens structure layer 5 may be realized by using alignment marks formed on the encapsulation layer 7 and the packaging cover plate 8, so as to reduce the difficulty in directly aligning process.

In some implementations, the supporting structure 11 is located in an edge region of the driving backplane 1 and/or in a region between the light-emitting pixel units 201.

Referring to FIG. 6, in some implementations, a medium layer 10 is disposed between the second metasurface micro-lens structure layer 5 and the packaging cover plate 8 (typically a glass cover plate): that is, before the second metasurface micro-lens structure layer is prepared on the packaging cover plate 8, the medium layer 10 is prepared, and by preparing the medium layer 10, bonding firmness between the second metasurface micro-lens structure layer 5 and the packaging cover plate 8 is improved.

With continued reference to FIGS. 4 and 6, in some implementations, a distance between each of centers of orthographic projections of the metasurface micro-lens structures 401 and 501 on the driving backplane 1 and a center of an orthographic projection of a light-exiting region of the light-emitting pixel unit 201 corresponding thereto on the driving backplane 1 is less than or equal to 0.3 μm: in some implementations, the centers of the orthographic projections of the metasurface micro-lens structures 401 and 501 on the driving backplane 1 coincide with the center of the orthographic projection of the light-exiting region of the light-emitting pixel unit 201 corresponding thereto on the driving backplane 1.

A distance between the centers of the orthographic projections of any two metasurface micro-lens structures 401 and 501, which are respectively located in different metasurface micro-lens structure layers 4 and 5 and correspond the same light-emitting pixel unit 201, on the driving backplane 1 is less than or equal to 0.3 μm. In some implementations, the centers of the orthographic projections of any two metasurface micro-lens structures 401 and 501, which are respectively located in different metasurface micro-lens structure layers 4 and 5 and correspond the same light-emitting pixel unit 201, on the driving backplane 1 coincide with each other.

In the embodiment of the present disclosure, an alignment error between each of the metasurface micro-lens structures 401 and 501 and the light-emitting pixel unit 201 corresponding thereto may range from 0 μm to 0.3 μm, and an alignment error between the different metasurface micro-lens structures 401 and 501 corresponding to the same light-emitting pixel unit 201 may range from 0 μm to 0.3 μm, so as to meet expectations on an alignment equipment with high precision in an existing production line.

In some implementations, all the metasurface micro-lens structures 401 and 501 located in different metasurface micro-lens structure layers 4 and 5 and corresponding to the same light-emitting pixel unit 201 constitute a metasurface composite micro-lens structure corresponding to the light-emitting pixel unit 201, and the light-emitting pixel unit 201 is located at a focal point of the metasurface composite micro-lens structure corresponding thereto. With such arrangement, light emitted from the light-emitting pixel unit 201 can reach the metasurface composite micro-lens structure corresponding thereto as much as possible, which is beneficial to improve the final luminance of the light-emitting pixel unit 201.

In some implementations, the numerical aperture of the metasurface composite micro-lens structure is greater than or equal to 0.7 to ensure to converge the light. It should be noted that the numerical aperture of the metasurface micro-lens structure in the embodiment of the present disclosure may be less than 0.7.

In some implementations, each of the metasurface micro-lens structures 401 and 501 includes a plurality of micro-pillars 9 having a same height: a ratio of a height of each micro-pillar 9 to an equivalent diameter of a cross-section of the micro-pillar 9 parallel to the driving backplane 1 is less than or equal to 5:1. In the embodiment of the present disclosure, an aspect ratio of each micro-pillar 9 is limited to be less than or equal to 5:1, so that the process difficulty in etching the micro-pillar 9 can be effectively reduced, meanwhile, the stability of standing of the micro-pillar 9 can be effectively promoted, avoiding the inclining of the micro-pillars 9.

In some implementations, the height of each micro-pillar 9 within each of the metasurface micro-lens structures 401 and 501 is in a range from 500 nm to 1000 nm, for example, may be equal to 500 nm, 750 nm, 850 nm, 100 nm, or the like.

In some implementations, the number of phase orders of the micro-pillars 9 in each of the metasurface micro-lens structure layers 4 and 5 ranges from 4 to 8. In the embodiment of the present disclosure, since the numerical aperture of each of the metasurface micro-lens structures 401 and 501 in the metasurface micro-lens structure layers 4 and 5 may be set to be relatively small, the number of phase orders of the micro-pillars 9 in each of the metasurface micro-lens structures 401 and 501 may also be set to be relatively small.

In some implementations, the numbers of phase orders of the metasurface micro-lens structures 401 and 501 in the metasurface micro-lens structure layer 4 and 5 are equal; the numbers of the micro-pillars 9 in the metasurface micro-lens structures 401 and 501 in the metasurface micro-lens structure layers 4 and 5 are equal; and the micro-pillars 9 in the metasurface micro-lens structures 401 and 501 in the metasurface micro-lens structure layers 4 and 5 are arranged in a same manner.

Certainly, the numbers of phase orders of the metasurface micro-lens structures 401 and 501 in the metasurface micro-lens structure layers 4 and 5 may also be set to be different, the numbers of the micro-pillars 9 in the metasurface micro-lens structures 401 and 501 in the metasurface micro-lens structure layers 4 and 5 may also be set to be different, and the micro-pillars 9 in the metasurface micro-lens structures 401 and 501 in the metasurface micro-lens structure layers 4 and 5 may be arranged in different manners.

Figure 7:
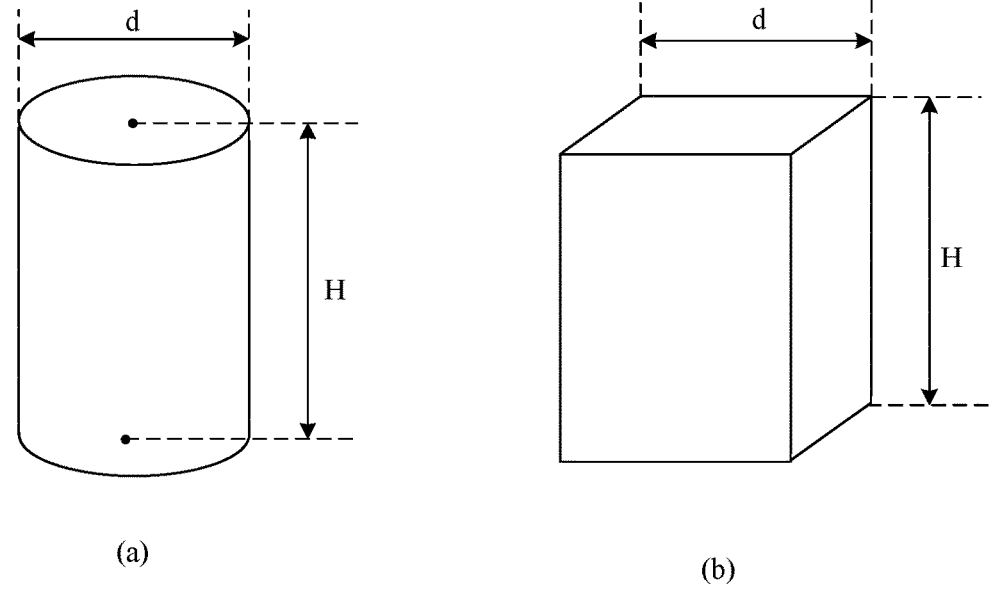
FIG. 7 is a schematic diagram of two different structures of a micro-pillar in an embodiment of the present disclosure.

FIG. 7 is a schematic diagram of two different structures of a micro-pillar in an embodiment of the present disclosure, and as shown in FIG. 7, in some implementations, a cross-section of each micro-pillar 9 parallel to the driving backplane 1 is circular (shown in part (a)) or square (shown in part (b)).

Referring to FIGS. 4 and 6, in some implementations, a distance L between any two adjacent metasurface micro-lens structure layers 4 and 5 in a direction perpendicular to the driving backplane 1 ranges from 0.8 μm to 1.2 μm.

In practical applications, it is found that if the distance L between two adjacent metasurface micro-lens structure layers 4 and 5 is too small, the maximum alignment error that can be tolerated between the two metasurface micro-lens structure layers 4 and 5 is small, so that the expectation on alignment precision is relatively high, which is difficult to be satisfied by the alignment equipment with high precision in the existing production line. If the distance L between two adjacent metasurface micro-lens structure layers 4 and 5 is too large, on one hand, an overall thickness of the display panel is too large, and on the other hand, the effect of the two adjacent metasurface micro-lens structure layers 4 and 5 converging light is affected. In view of above, in the embodiment of the present disclosure, the distance L between any two adjacent metasurface micro-lens structure layers 4 and 5 in the direction perpendicular to the driving backplane 1 ranges from 0.8 μm to 1.2 μm.

In the solution shown in FIG. 4, the transparent spacer layer 6 is arranged between the two adjacent metasurface micro-lens structure layers 4 and 5, and the distance between the two adjacent metasurface micro-lens structure layers 4 and 5 may be controlled by designing the thickness of the transparent spacer layer 6. In the solution shown in FIG. 6, the distance between the first metasurface micro-lens structure layer 4 and the second metasurface micro-lens structure layer 5 may be controlled by designing a height of each supporting structure 11.

In some implementations, the number of the metasurface micro-lens structure layers in the metasurface composite structure layer 3 is two.

As a specific example, two metasurface micro-lens structure layers are provided in the metasurface composite structure layer 3, and include the first metasurface micro-lens structure layer 4 and the second metasurface micro-lens structure layer 5 located on a side of the first metasurface micro-lens structure layer 4 away from the driving backplane 1.

Taking the structure of the display panel in FIG. 4 as an example, the lens aperture D1 of the metasurface micro-lens structure 401 in the first metasurface micro-lens structure layer 4 is designed to be 4.5 μm, the focal length f1 is designed to be 4.869 μm, the numerical aperture NA1 is designed to be 0.629, the number m1 of phase orders is designed to be 8, each micro-pillar 9 in the metasurface micro-lens structure is made of silicon oxide, the refractive index n1 of each micro-pillar 9 is designed to be 2.03, and the height H1 of each micro-pillar 9 is designed to be 850 nm; the lens aperture D2 of the metasurface micro-lens structure 501 in the second metasurface micro-lens structure layer 5 is designed to be 4.5 μm, the focal length f2 is designed to be 8.566 μm, the numerical aperture NA2 is designed to be 0.381, the number m2 of phase orders is designed to be 8, each micro-pillar 9 in the metasurface micro-lens structure is made of silicon oxide, the refractive index n2 of each micro-pillar 9 is designed to be 2.03, and the height H2 of each micro-pillar 9 is designed to be 850 nm; the transparent spacer layer 6 positioned between the first metasurface micro-lens structure layer 4 and the second metasurface micro-lens structure layer 5 is designed to have the refractive index of 1.3, and the thickness of 100 nm; the numerical aperture NA' of the finally achieved metasurface composite micro-lens structure is 0.9, the equivalent diameter of each micro-pillar 9 ranges from 140 nm to 600 nm, so that an expectation that the aspect ratio of the micro-pillar 9 is less than 5:1 is satisfied.

In practical applications, the number and distribution of the micro pillars 9 in the metasurface micro-lens structure within each metasurface micro-lens structure layer, and the equivalent diameter of each type of micro pillars 9 can be optimized and obtained by simulation software (e.g., FDTD, Comsol, Zemax, Lighttools, or the like).

Figure 8A:
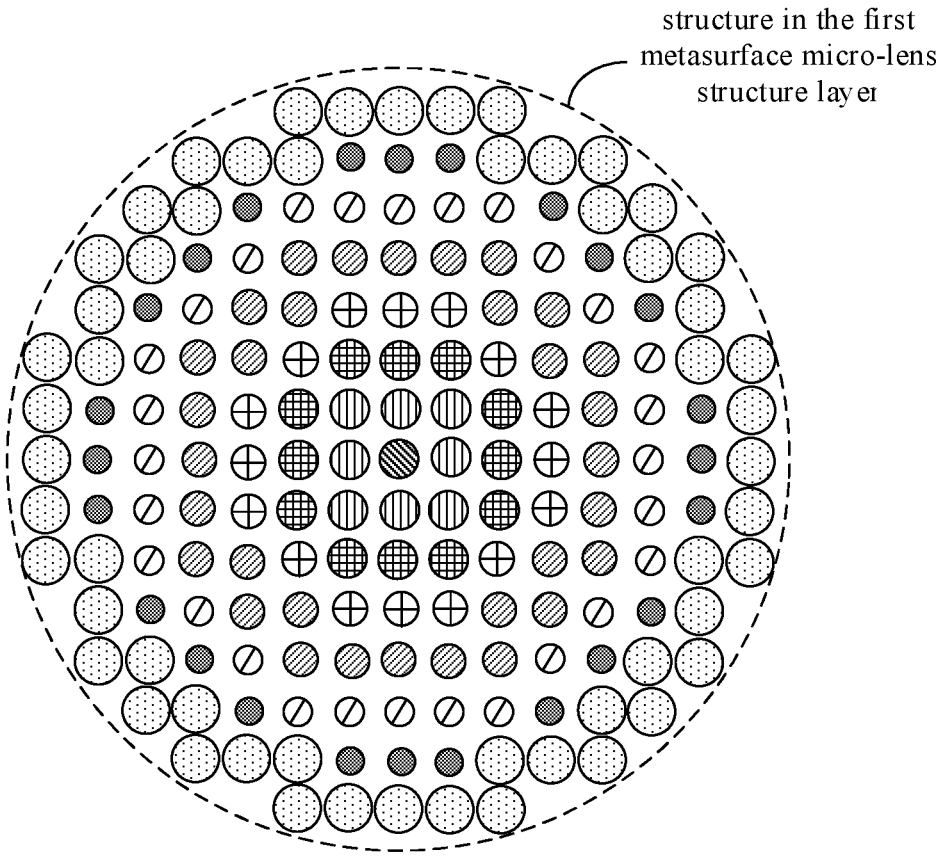
FIG. 8A is a schematic top view of a metasurface micro-lens structure in a first metasurface micro-lens structure layer in an embodiment of the present disclosure.
Figure 8B:
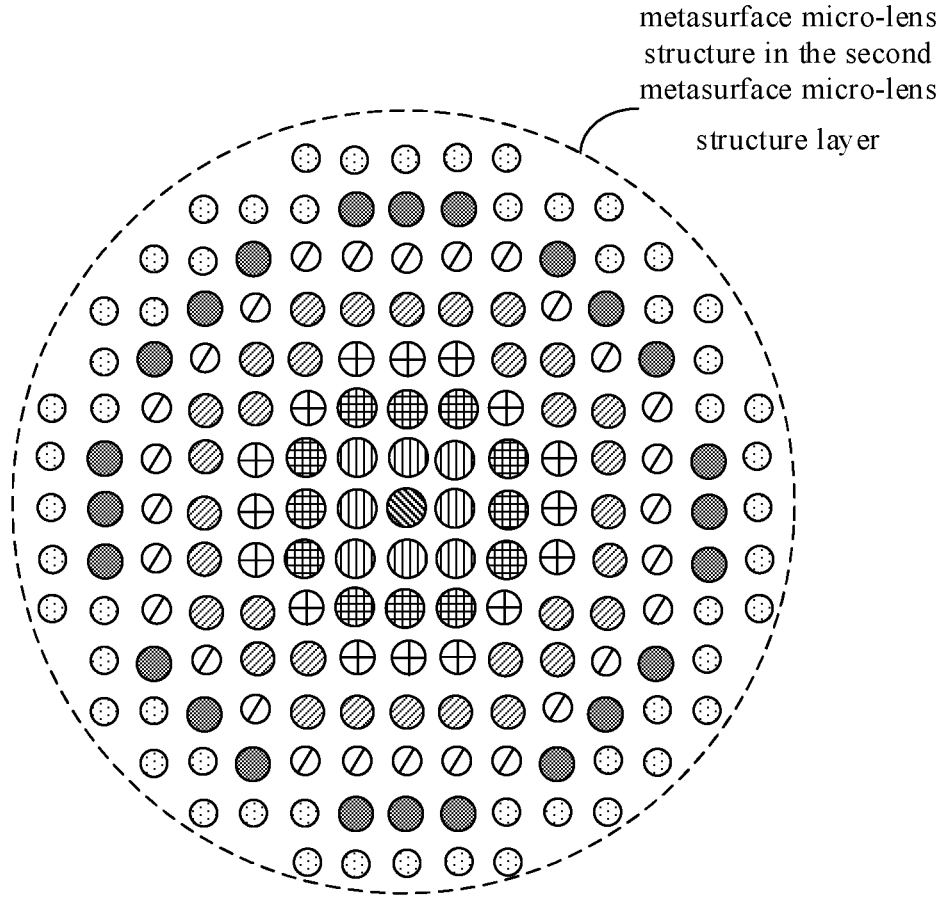
FIG. 8B is a schematic top view of a metasurface micro-lens structure in a second metasurface micro-lens structure layer in an embodiment of the present disclosure.

FIG. 8A is a schematic top view of a metasurface micro-lens structure in the first metasurface micro-lens structure layer in an embodiment of the present disclosure, and FIG. 8B is a schematic top view of a metasurface micro-lens structure in the second metasurface micro-lens structure layer in an embodiment of the present disclosure, and as shown in FIGS. 8A and 8B, each of the number of phase orders of the metasurface micro-lens structure in the first metasurface micro-lens structure layer and the number of phase orders of the metasurface micro-lens structure in the second metasurface micro-lens structure layer is equal to 8: each of the number of the micro-pillars 9 in the metasurface micro-lens structure in the first metasurface micro-lens structure layer and the number of the micro-pillars 9 in the metasurface micro-lens structure in the second metasurface micro-lens structure layer is equal to 177: the micro-pillars 9 in the metasurface micro-lens structure in the first metasurface micro-lens structure layer and the micro-pillars 9 in the metasurface micro-lens structure in the second metasurface micro-lens structure layer are arranged in a same manner.

Figure 9:
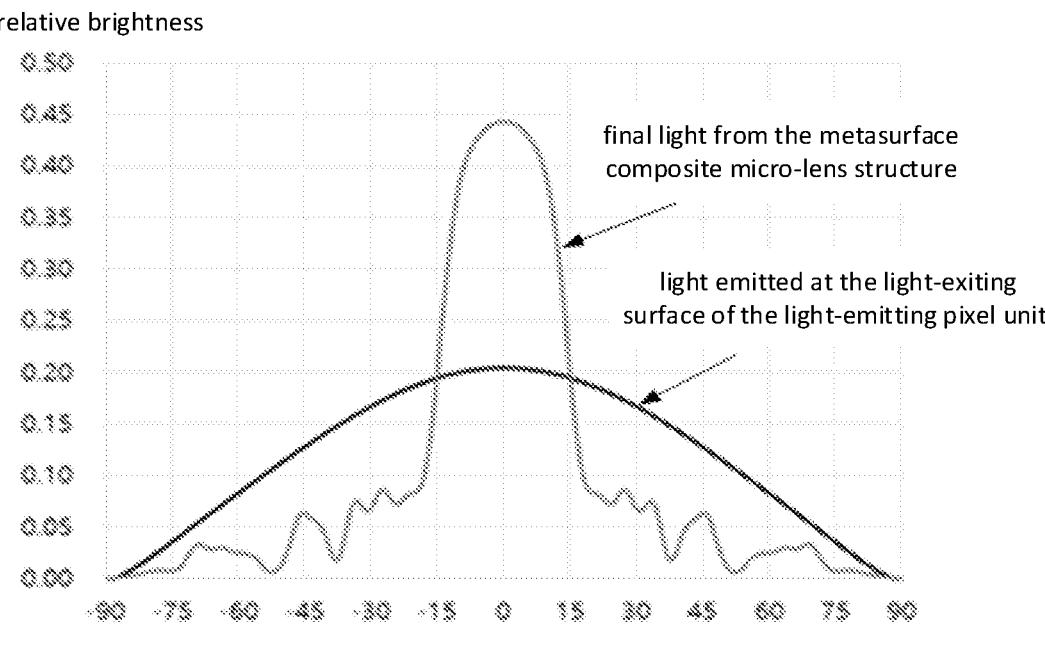
FIG. 9 is a schematic diagram illustrating a comparison between a curve of an angular brightness distribution at a light-exiting surface of a light-emitting pixel unit in the display panel and a curve of an angular brightness distribution of final light emitted from a metasurface composite micro-lens structure corresponding to the light-emitting pixel unit in an embodiment of the present disclosure

FIG. 9 is a schematic diagram illustrating a comparison between a curve of an angular brightness distribution at the light-exiting surface of the light-emitting pixel unit in the display panel and a curve of an angular brightness distribution of the final light emitted form the metasurface composite micro-lens structure corresponding to the light-emitting pixel unit, and as shown in FIG. 9, after the metasurface composite structure layer 3 is disposed, the brightness of the light emitted from the metasurface composite micro-lens structure in the direction at the front viewing angle (ranging from −15° to +15°) is about 2 times the brightness of the light emitted from the light-exiting surface of the light-emitting pixel unit 201 in the direction ath the front viewing angle.

Figure 10:
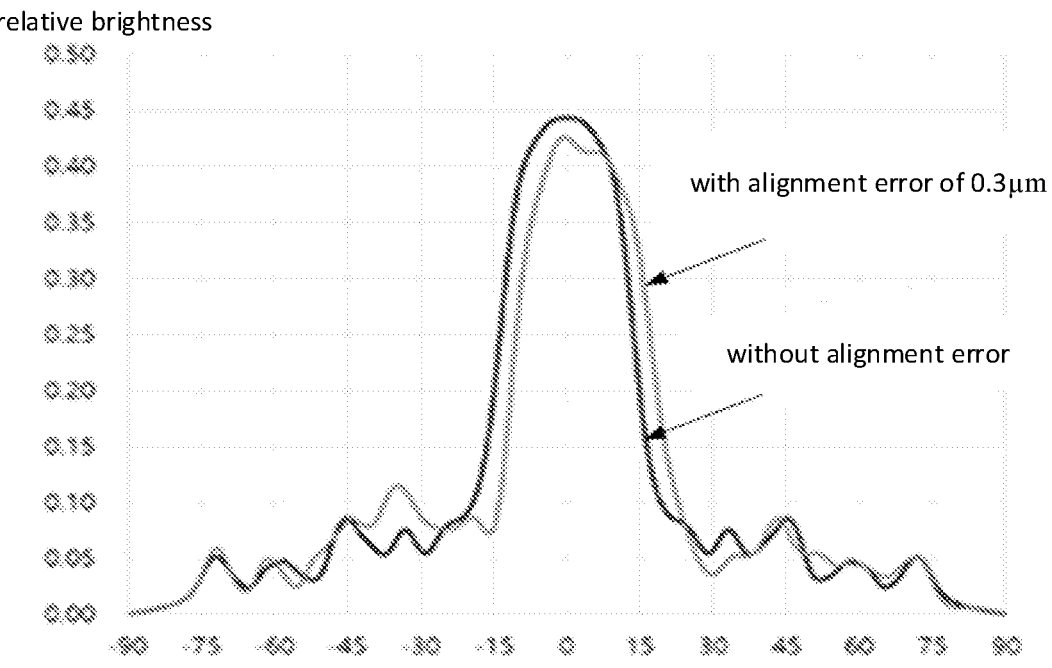
FIG. 10 is a schematic diagram illustrating a comparison of angular brightness distribution curves of final light emitted from a metasurface composite micro-lens structure with an alignment error and without an alignment error in the embodiment of the present disclosure.

FIG. 10 is a schematic diagram illustrating a comparison of angular brightness distribution curves of final light emitted from the metasurface composite micro-lens structure with an alignment error and without an alignment error in the embodiment of the present disclosure, as shown in FIG. 10, compared with the brightness of light emitted from the metasurface-composite micro-lens structure in the direction at the front viewing angle in a case where no alignment error occurs, in a case where an alignment error of 0.3 μm occurs between the metasurface micro-lens structures 401 and 501 and the light-emitting pixel unit 201 corresponding thereto, or an alignment error of 0.3 μm occurs between different metasurface micro-lens structures 401 and 501 corresponding to the same light-emitting pixel unit 201, the loss in brightness of light emitted from the metasurface composite micro-lens structure in the direction at the front viewing angle is less than 5%: the loss in brightness caused by the alignment error is small, and the display quality of the product is not substantially influenced.

Figure 11:
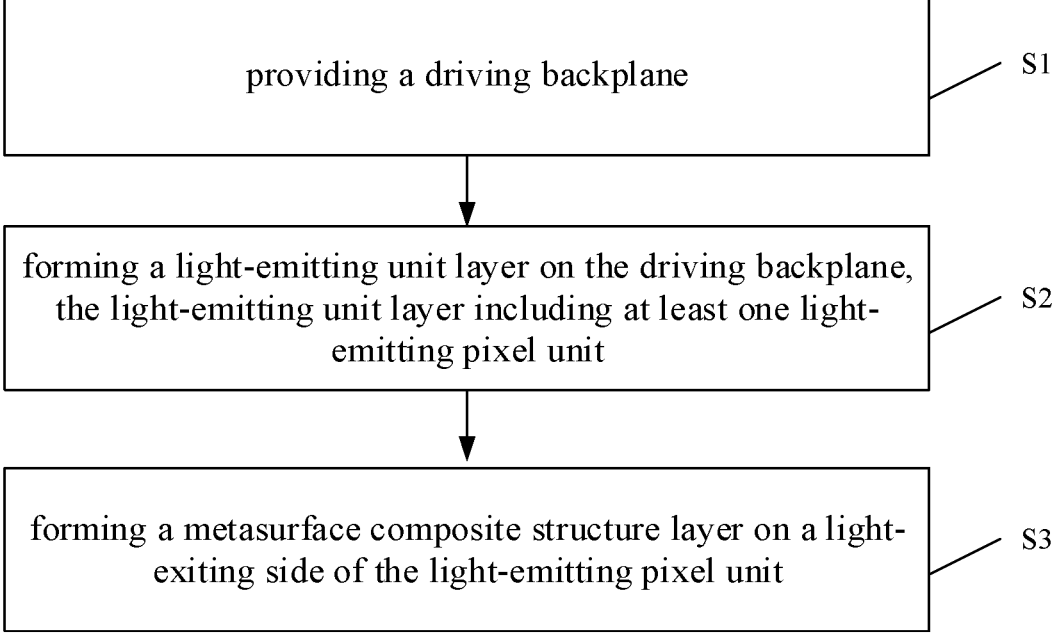
FIG. 11 is a flowchart of a method for manufacturing a display panel in an embodiment of the present disclosure.

Based on the same inventive concept, an embodiment of the disclosure further provides a method for manufacturing a display panel. FIG. 11 is a flowchart of a method for manufacturing a display panel according to an embodiment of the present disclosure, and as shown in FIG. 11, the method for manufacturing the display panel in the forgoing embodiment includes:

Step S1, providing a driving backplane;

Step S2, forming a light-emitting unit layer on the driving backplane, with the light-emitting unit layer including at least one light-emitting pixel unit; and Step S3, forming a metasurface composite structure layer on a light-exiting side of the light-emitting pixel unit, where the metasurface composite structure layer includes: at least two metasurface micro-lens structure layers, which are sequentially arranged in a direction away from the light-emitting pixel unit and are independent of each other, and the metasurface micro-lens structure layers are configured to modulate a phase of light incident thereinto so as to converge the light.

In some implementations, in a case where a transparent spacer layer is formed between any two adjacent metasurface micro-lens structure layers, the step S3 may include: alternately forming the metasurface micro-lens structure layer and the transparent spacer layer on the light-exiting side of the light-emitting pixel unit. As a specific example, referring to FIG. 4, a first metasurface micro-lens structure layer may be formed firstly, then a transparent spacer layer may be formed, and next a second metasurface micro-lens structure layer may be formed.

In some implementations, a packaging cover plate is formed on a side of the metasurface composite structure layer away from the driving backplane, and the at least two metasurface micro-lens structure layers include a first metasurface micro-lens structure layer and a second metasurface micro-lens structure layer; a supporting structure is formed between the packaging cover plate and the driving backplane, and the supporting structure is configured to support the packaging cover plate and the driving backplane; the first metasurface micro-lens structure layer is fixed to the driving backplane, and the second metasurface micro-lens structure layer is fixed to the packaging cover plate. In this case, the step S3 may include: firstly, forming the first metasurface micro-lens structure layer on a side of the light-emitting unit layer away from the driving backplane, and forming the second metasurface micro-lens structure layer on a side of the packaging cover plate close to the driving backplane; and then, forming the supporting structure between the driving backplane and the packaging cover plate, and aligning and fixing the driving backplane with the packaging cover plate.

For the detailed description of each step, reference may be made to the corresponding contents in the foregoing embodiment, which are not described herein again.

Based on the same inventive concept, an embodiment of the present disclosure further provides a display device, which includes the display panel provided by the foregoing embodiment. The display device may be any product or component with a display function, such as a mobile phone, a tablet computer, a television, a display, a notebook computer, a digital photo frame, a navigator and the like.

It will be understood that the above embodiments are merely exemplary embodiments employed to illustrate the principles of the present disclosure, and the present disclosure is not limited thereto. It will be apparent to those skilled in the art that various improvements and modifications can be made without departing from the spirit and scope of the present disclosure, and these improvements and modifications are to be considered within the scope of the present disclosure.

17

What is claimed is:

1. A display panel, comprising:

a driving backplane;

a light-emitting unit layer located on a side of the driving backplane and comprising at least one light-emitting pixel unit;

a metasurface composite structure layer located on a light-exiting side of the light-emitting pixel unit and comprising at least two metasurface micro-lens structure layers, which are sequentially arranged in a direction away from the light-emitting pixel unit and are independent of each other, wherein the metasurface micro-lens structure layers are configured to modulate a phase of light incident thereinto so as to converge the light, and wherein a transparent spacer layer is formed between adjacent metasurface micro-lens structure layers, and wherein the transparent spacer layer is in contact with the metasurface micro-lens structure layers closest thereto at both sides thereof; and a refractive index of the transparent spacer layer is less than that of each of the metasurface micro-lens structure layers in contact therewith.

2. The display panel of claim 1, wherein a packaging cover plate is provided at a side of the metasurface composite structure layer away from the driving backplane.

3. The display panel of claim 1, wherein the metasurface micro-lens structure comprises a plurality of micro-pillars having a same height; and a ratio of the height of each micro-pillar to an equivalent diameter of a cross-section of the micro-pillar parallel to the driving backplane is less than or equal to 5:1.

4. The display panel of claim 3, wherein a number of phase orders of the micro-pillars of the metasurface micro-lens structure in each metasurface micro-lens structure layer ranges from 4 to 8.

5. The display panel of claim 3, wherein numbers of phase orders of the metasurface micro-lens structures in the metasurface micro-lens structure layers are the same;

numbers of the micro-pillars in the metasurface micro-lens structures in the metasurface micro-lens structure layers are the same;

the micro-pillars in the metasurface micro-lens structures in the metasurface micro-lens structure layers are arranged in a same manner.

6. The display panel of claim 3, wherein a cross-section of each micro-pillar parallel to the driving backplane is circular or square.

7. The display panel of claim 1, wherein a distance between any two adjacent metasurface micro-lens structure layers in a direction perpendicular to the driving backplane ranges from 0.8 μm to 1.2 μm.

8. The display panel of claim 1, wherein a number of the metasurface micro-lens structure layers in the metasurface composite structure layer is two.

9. The display panel of claim 1, wherein an encapsulation layer is provided between the light-emitting unit layer and the metasurface composite structure layer.

10. A display device, comprising the display panel of claim 1.

11. A method of manufacturing the display panel of claim 1, comprising:

providing a driving backplane;

forming a light-emitting unit layer on the driving backplane, the light-emitting unit layer comprising at least one light-emitting pixel unit;

forming a metasurface composite structure layer on a light-exiting side of the light-emitting pixel unit, wherein the metasurface composite structure layer comprises at least two metasurface micro-lens structure layers, which are sequentially arranged in a direction away from the light-emitting pixel unit and are independent of each other, and the metasurface micro-lens structure layers are configured to modulate a phase of light incident thereinto so as to converge the light, and forming a transparent spacer layer between adjacent metasurface micro-lens structure layers, wherein the forming the metasurface composite structure layer on the light-exiting side of the light-emitting pixel unit comprises:

alternately forming the metasurface micro-lens structure layer and a transparent spacer layer on the light-exiting side of the light-emitting pixel unit.

12. The method of claim 11, wherein a pakaging cover plate is provided on a side of the metasurface composite structure layer away from the driving backplane; the at least two metasurface micro-lens structure layers comprise: a first metasurface micro-lens structure layer and a second metasurface micro-lens structure layer; a supporting structure is provided between the packaging cover plate and the driving backplane, the supporting structure being configured to support the packaging cover plate and the driving backplane; and the first metasurface micro-lens structure layer is fixed to the driving backplane, and the second metasurface micro-lens structure layer is fixed to the packaging cover plate; and wherein the forming the metasurface composite structure layer on the light-exiting side of the light-emitting pixel unit comprises:

forming a first metasurface micro-lens structure layer on a side of the light-emitting unit layer away from the driving backplane;

forming a second metasurface micro-lens structure layer on a side of the packaging cover plate close to the driving backplane; and forming a supporting structure between the driving backplane and the packaging cover plate, and aligning and fixing the driving backplane with the packaging cover plate.

13. A display panel, comprising:

a driving backplane;

a light-emitting unit layer located on a side of the driving backplane and comprising at least one light-emitting pixel unit;

a metasurface composite structure layer located on a light-exiting side of the light-emitting pixel unit and comprising at least two metasurface micro-lens structure layers, which are sequentially arranged in a direction away from the light-emitting pixel unit and are independent of each other, wherein the metasurface micro-lens structure layers are configured to modulate a phase of light incident thereinto so as to converge the light, wherein a packaging cover plate is provided on a side of the metasurface composite structure layer away from the driving backplane;

the at least two metasurface micro-lens structure layers comprise: a first metasurface micro-lens structure layer and a second metasurface micro-lens structure layer;

a supporting structure is provided between the packaging cover plate and the driving backplane, the supporting structure being configured to support the packaging cover plate and the driving backplane; and the first metasurface micro-lens structure layer is fixed to the driving backplane, and the second metasurface micro-lens structure layer is fixed to the packaging cover plate.

14. The display panel of claim 13, wherein the supporting structure is located in at least one of an edge region of the driving backplane or a region between adjacent light-emitting pixel units.

15. A display panel, comprising:

a driving backplane;

a light-emitting unit layer located on a side of the driving backplane and comprising at least one light-emitting pixel unit;

a metasurface composite structure layer located on a light-exiting side of the light-emitting pixel unit and comprising at least two metasurface micro-lens structure layers, which are sequentially arranged in a direction away from the light-emitting pixel unit and are independent of each other, wherein the metasurface micro-lens structure layers are configured to modulate a phase of light incident thereinto so as to converge the light, wherein each metasurface micro-lens structure layer comprises at least one metasurface micro-lens structure corresponding to the light-emitting pixel unit one by one, with the metasurface micro-lens structure being arranged opposite to the light-emitting pixel unit corresponding thereto, and a distance between a center of an orthographic projection of the metasurface micro-lens structure on the driving backplane and a center of an orthographic projection of a light-exiting region of the light-emitting pixel unit corresponding to the metasurface micro-lens structure on the driving backplane being less than or equal to 0.3 μm;

a distance between centers of orthographic projections of any two metasurface micro-lens structures, corresponding to the same light-emitting pixel unit, in different metasurface micro-lens structure layers on the driving backplane is less than or equal to 0.3 μm.

16. The display panel of claim 15, wherein all the metasurface micro-lens structures corresponding to the same light-emitting pixel unit and located in different metasurface micro-lens structure layers constitute a metasurface composite micro-lens structure corresponding to the light-emitting pixel unit; and the light-emitting pixel unit is located at a focal point of the metasurface composite micro-lens structure corresponding thereto.

17. The display panel of claim 15, wherein all the metasurface micro-lens structures corresponding to the same light-emitting pixel unit and located in different metasurface micro-lens structure layers constitute a metasurface composite micro-lens structure corresponding to the light-emitting pixel unit; and a numerical aperture of the metasurface composite micro-lens structure is greater than or equal to 0.7.

*    *    *    *    *